(12) United States Patent
Blake et al.

(10) Patent No.: US 8,778,208 B2
(45) Date of Patent: Jul. 15, 2014

(54) METHOD AND ARTICLE

(75) Inventors: Peter Blake, Hertford (GB); Timothy John Booth, Loughton (GB)

(73) Assignee: Graphene Industries Limited, Manchester, Lancashire (GB)

( * ) Notice: Subject to any disclaimer, the term of this patent is extended or adjusted under 35 U.S.C. 154(b) by 140 days.

(21) Appl. No.: 12/934,325

(22) PCT Filed: Mar. 26, 2009

(86) PCT No.: PCT/GB2009/050295
§ 371 (c)(1),
(2), (4) Date: Sep. 24, 2010

(87) PCT Pub. No.: WO2009/118564
PCT Pub. Date: Oct. 1, 2009

(65) Prior Publication Data
US 2011/0017390 A1    Jan. 27, 2011

(30) Foreign Application Priority Data

Mar. 26, 2008   (GB) .................................. 0805473.6

(51) Int. Cl.
*B44C 1/22* (2006.01)
*B81C 1/00* (2006.01)
*B81C 99/00* (2010.01)

(52) U.S. Cl.
CPC ........... *B81C 1/00158* (2013.01); *B81C 99/008* (2013.01); *B81B 2203/0127* (2013.01)
USPC .................... 216/83; 216/2; 216/41

(58) Field of Classification Search
CPC .............. B81C 1/00158; B81C 99/008; B81B 2203/0127

USPC .................................................. 216/2, 41, 83
See application file for complete search history.

(56) References Cited

U.S. PATENT DOCUMENTS

| 7,989,067 B2 * | 8/2011 | DeHeer ......................... 428/408 |
| 2009/0291270 A1 * | 11/2009 | Zettl et al. .................. 428/195.1 |
| 2011/0079710 A1 * | 4/2011 | Damiano et al. ............... 250/307 |

FOREIGN PATENT DOCUMENTS

JP          2003305739 A    10/2003

OTHER PUBLICATIONS

XP0121055201 "Mechanical Properties of Suspended Graphene Sheets" Frank I. et al.,Journal of Vacuum Science and Technology: Part B, AVS/AIP, Melville, NY, vol. 25, No. 6, pp. 2258-2561, Dec. 2007.
XP022130938 "On the Roughness of Single and Bi-Layer Graphene Membranes" Meyer et al., Solid State Communications, Pergamon, Great Britain, Vol, 143, No. 1-2, pp. 101-109, Jun. 2007.

(Continued)

*Primary Examiner* — Shamim Ahmed
(74) *Attorney, Agent, or Firm* — Norris McLaughlin & Marcus PA

(57) ABSTRACT

A method of making an article 2 comprising an ultra-thin sheet 26 of material secured at lateral regions to a support member, the method comprises laying the ultra-thin sheet on a substrate 20, forming the support member on the lateral regions of the ultra-thin sheet such that the lateral regions of the ultra-thin sheet are sandwiched between the support member and the substrate and adhered to the support member, and removing the substrate by vaporisation or by a dissolution step using a solvent, to leave the article. The ultra-thin sheet is supported around its periphery and has a central region in which the ultra-thin sheet is free from contact with any other material.

13 Claims, 1 Drawing Sheet

(56) References Cited

OTHER PUBLICATIONS

The Structure of Suspended Graphene Sheets, Jannik C. Meyer et al., Nature Letters, Nature Publishing Group, 2007.
Nature Letters Supplementary Information connected to #3 above.
International Preliminary Report on Patentability for PCT/GB2009/050295 dated Sep. 28, 2010.
English summary of Japanese Office Action for Application 2011-501301 dated Sep. 10, 2013.

* cited by examiner

METHOD AND ARTICLE

This application filed under 35 USC of PCT/GB2009/05095.

This invention relates to a method of mounting an ultra-thin sheet, and to an article in the form of an ultra-thin sheet on a support member.

The term ultra-thin sheet is used herein to denote a sheet of material whose mean thickness does not exceed 100 nm. The ultra-thin sheet may also be called a flake; these two terms are interchangeable.

At the extreme an ultra-thin sheet may be monoatomically thin.

One example of a material which can be produced as a monoatomically thin sheet is graphene, which is described by J. C. Meyer, A. K. Geim, M. I. Katsnelson, K. S. Novoselov, T. J. Booth and S. Roth, Nature 446, 60 (2007), Letters (URL doi:10.1038/nature05545).

Although ultra-thin sheets may have remarkable mechanical properties it is the case, on account of their extreme thinness, that their handling represents a considerable challenge.

According to the Supplementary Information to the Nature reference given above a graphene flake is prepared on top of an oxidised silicon wafer by micromechanical cleavage. Its thickness may be assessed by optical microscopy and if necessary double-checked by atomic force microscopy. A metal grid (3 nm Cr, 100 nm Au) is then deposited on top of the flake using electron-beam lithography. After that the substrate is cleaved so that its cleaved face is within 50 µm of the flake. The sample is then immersed in 15% tetramethylammonium hydroxide (TMAH) at 60° C. for several hours, which etches away the bulk silicon, undercutting the grid. The etching is monitored through an optical microscope and stopped after a sufficient part of the grid becomes overhanging. The remaining $SiO_2$ layer is removed during 35 minutes in 6% buffered hydrofluoric acid (HF). Great care is then needed in handling the part, and in drying it, to prevent the flake being damaged by surface tension in the drying medium. The sample is then transferred into water, isopropanol, acetone and, finally, liquid carbon dioxide for critical point drying.

This known process captures a graphene flake but has drawbacks. Exposing the grid from the edge of the substrate in this way requires that the grid remains attached to a small piece of substrate. This piece of substrate is required for handling the grid (and hence the graphene), but limits the utility of the graphene/grid structure since its lateral dimensions (typically 1 mm) exceed that of the grid (typically 10 µm) by two orders of magnitude. This remaining substrate is an undesirable artefact of the processing technique. For example, it complicates the insertion of the structure in a transmission electron microscope (designed to take thin (50 µm) circular foils), and being brittle and fragile is susceptible to damage by fracture during handling. These drawbacks limit the uses to which the graphene flake can be put. Furthermore the etching steps require careful control. The use of the aggressive etching solutions tetramethyl ammonium hydroxide and hydrogen fluoride is undesirable. The grid is only supported from one side. It is thus easily destroyed by contact, will be damaged by surface tension forces if a wet grid is allowed to dry, and will readily pick up external vibrations.

It is an object of the present invention to provide an improved method for handling and/or mounting graphene, and other ultra-thin sheets.

In accordance with a first aspect of the present invention there is provided a method of making an article which comprises an ultra-thin sheet of material secured at its lateral regions to a support member, the method comprising providing an ultra-thin sheet on a substrate, forming the support member on the lateral regions of the ultra-thin sheet such that the lateral regions of the ultra-thin sheet are sandwiched between the support member and the substrate and adhered to the support member, and removing the substrate to leave the article. This removal step is exemplified by FIG. 2x), A, B and C paths, in the accompanying drawings.

The substrate may be removed by vaporisation.

The substrate may be removed by a dissolution step using a solvent.

An ultra-thin sheet may be laid onto the substrate. For example it may be pre-formed at one location, and applied to the substrate at a different location. In another embodiment an ultra-thin sheet may be formed in situ on the substrate. For example it may be epitaxially grown on the substrate.

Preferably the support member is formed in situ on the substrate, as well as on the lateral regions of the ultra-thin sheet.

Preferably the ultra-thin sheet has at least one region inboard of said lateral regions, which inboard region is free from being overlaid with any other material. That is to say, there is only the ultra-thin sheet present in such a region, or regions, which we call herein free region(s).

The support member may have a central region and, around it, a peripheral region. The peripheral region may, for example, be of annular, elliptical or polygonal shape. The peripheral region is adhered to the lateral regions of the ultra-thin sheet. The peripheral region may make end-less contact with the lateral regions of the ultra-thin sheet; for example it may make contact all the way around an annulus, ellipse or polygon. In one preferred embodiment the support member has no parts in the central region, which is all free area. In another embodiment it has one or more supports, for example, bars extending into it, so that it has a plurality of free areas. In any embodiment, however, there is suitably a free area of ultra-thin sheet at least 500 µm$^2$, preferably at least 1,000 µm$^2$, preferably at least 2,000 µm$^2$, and most preferably at least 5,000 µm$^2$. The free area is limited only by the lateral extent of the ultra-thin sheet. In contrast typical free areas produced via the method described in the supplementary information of the Nature paper referenced above are in the range 10-100 µm$^2$.

Preferably the thickness of the support member is at least 10 µm, preferably at least 15 µm, preferably at least 25 µm.

Preferably the thickness of the support member is up to 100 µm, preferably up to 80 µm, most preferably up to 50 µm.

Preferably the thickness of the substrate is at least 50 µm, preferably at least 100 µm, most preferably at least 250 µm.

Preferably the thickness of the substrate is up to 5 mm, preferably up to 2 mm, most preferably up to 750 µm.

The substrate could be entirely vaporisable or soluble in the solvent, as illustrated in FIG. 2x), path C of the accompanying drawings. The substrate could be of a material which could be cleaved, to remove part of it, and then subjected to heat to vaporise the remainder, or to a solvent to dissolve the remainder. For example the substrate could be an inert, stable, flat material, preferably a material which can be polished. Suitable materials include metals, ceramics, including silicon and silicon carbide, and polymers. The substrate may be non-conductive. It may in some embodiments be conductive, and this may facilitate electrochemical deposition processes which will be hereafter described. The substrate is preferably a crystalline material, but in certain embodiments may be non-crystalline.

In a preferred embodiment of the present invention the substrate comprises a release layer over a base layer, the release layer being in contact with the ultra-thin sheet, and being vaporisable, or more soluble than the base layer in a selected solvent. For practical purposes the release layer may be regarded as vaporisable, or as soluble in the selected solvent, and the base layer may be regarded as non-vaporisable, or insoluble in that solvent. The base layer may be as is described above for the substrate.

The release layer could be applied through spin-coating, dip-coating, spraying etc. It could, for example, be an acrylate polymer; for example polymethyl methylmethacrylate (PMMA), which readily dissolves in a polar solvent, such as acetone. Spin-on polymers of many different kinds can be chosen, and many polymers can be readily dissolved with solvents such as N-methylpyrolidone (NMP) or dimethylformamide (DMF).

The important principle is that when the release layer is removed, for example by vaporisation or by dissolution in the selected solvent, the base layer falls away, preferably substantially intact, i.e. undissolved, or unvaporised. The base layer preferably remains as a monolith, uneroded, which can be recovered, washed, and re-used. Alternatively, where the ultra-thin sheet has been formed epitaxially or through micromechanical cleavage on a soluble, and preferably conductive, substrate the release layer may be omitted. As illustrated in FIG. 2, path C illustrates this method for a conductive base layer.

Preferably the thickness of the release layer, when present, is at least 5 nm, preferably at least 30 nm, preferably at least 60 nm, most preferably at least 80 nm, and preferably at least 250 nm.

Preferably the thickness of the release layer, when present, is up to 100 µm, preferably up to 10 µm, and preferably up to 1 µm. More preferably it is of thickness up to 600 nm, more preferably up to 400 nm, and yet more preferably up to 300 nm. In certain embodiments it may be up to 200 nm, preferably up to 150 nm, and preferably up to 100 nm.

In one realisation of the invention the thickness of the release layer can be chosen so as to maximise the optical contrast of the ultra-thin sheet. We have found that when the ultra-thin sheet is graphene and the release layer is PMMA, that suitable thicknesses of the release layer to maximise the optical contrast of the graphene are 80-100 nm, and 250-300 nm.

Preferably the ultra-thin sheet is formed by micromechanical cleavage from a larger body, preferably a layered body, of the same material. Micromechanical cleavage may be achieved using adhesive sheet or tape, which may also be used to transfer the resulting ultra-thin sheet to the substrate. Alternative means for producing the ultra-thin sheets include (but are not limited to) epitaxial formation on the surface of the substrate through, for example, the partial thermal decomposition of silicon carbide to produce graphene; or the growth of the ultra-thin sheet from a vapour phase on a suitable substrate, e.g. graphene formation on a nickel, iridium or platinum substrate. As is described above with reference to the prior art, the thickness of the ultra-thin sheet may be assessed by colour shift using optical microscopy, Raman spectroscopy or by atomic force microscopy.

Any material able to form an ultra-thin sheet could be used in the present invention. Examples include layered metal dichalcogenides such as $MoS_2$, $NbSe_2$, layered compounds such as graphitic materials (including monolayer graphene—the name used for a single atomic layer of graphite sheet; or few-layer graphene—the name used for less than 10 atomic layers of graphite sheet), including doped variants of graphitic/graphene materials, and structural analogues such as boron nitride, including layered compounds such as high critical temperature superconductor materials and layered ceramics.

As noted above an ultra-thin sheet in this specification is a sheet of mean thickness not exceeding 100 nm. In preferred embodiments of this invention the sheet is of mean thickness not exceeding 50 nm, preferably not exceeding 30 nm, preferably not exceeding 10 nm. More preferably the ultra-thin sheet is of mean thickness not exceeding 5 nm, more preferably not exceeding 1 nm. In especially preferred embodiments the sheet is 1-10 atomic layers in thickness, and most preferably of monoatomic thickness.

Ultra-thin sheets may have a topography: for example, puckered or corrugated. In the case of a monoatomic graphene sheet the amplitude of the sheet (distance between peak and trough) may be of the order of 0.1-3 nm. Our definition of ultra-thin denotes the through-thickness of the sheet, not the amplitude of a sheet which has such a topography.

Preferably the support member is of a material which is formed from a liquid, for example from a solution, or from a vapour. In one embodiment it is deposited from a solution, for example by a chemical reaction, which precipitates the solid material which forms the support member. In another embodiment the solid material may be formed by electrochemical deposition. In another embodiment the solid material may be produced from a liquid by solidification (freezing) of the liquid caused by temperature reduction and/or seeding. In another embodiment the solid material may be produced by evaporation of a solvent; such a material is suitably a polymeric material. In another embodiment the material may be evaporated from the solid phase to condense on the substrate. Such a material may suitably be metallic.

A polymeric material as the material of the support member may be a lithographic material; by which we mean it may be made less soluble, or more soluble, in a given solvent, by irradiation.

The support member may be an insulator, for example a non-conductive polymeric material.

The support member may be conductive, for example, a metallic material or a conductive polymer. Suitably it may be, or may comprise copper, nickel, tungsten, gold or silver; or any alloy thereof; or any alloy thereof in which such metal(s) provide/s at least 50% wt/alloy wt.

Most preferably the support member has an underlayer which is in direct contact with the lateral regions of the ultra-thin sheet. Preferably the underlayer is also in contact with the substrate, in the method. The underlayer suitably comprises a first inert metallic material, for example silver, platinum or, preferably, gold; and, optionally, a second metallic material, for example chromium, titanium, tungsten or aluminium, as an adhesion layer, with the first metallic material then being a strike layer. The material for the adhesion layer is chosen so as to maximise the adhesion of the ultra-thin sheet to the strike layer. The strike provides a clean, conductive surface to encourage the uniform growth of deposited (preferably, electrodeposited material).

The underlayer, when present, may suitably be of thickness in the range 10-1000 nm, preferably 50-200 nm. The layer of second metallic material, when present, is suitably of thickness in the range 1-30 nm.

In total, including any underlayer present, the support member may be of thickness in the range 1-50 µm, preferably 5-30 µm.

Preferably the support member is formed on the substrate whilst one or more regions of the ultra-thin sheet is/are masked, so that the support member cannot form in such region(s). This stage is represented by FIG. 2*ix*), A, B and C paths, in the accompanying drawings.

In certain embodiments this masking is achieved by lithographic means. For example, an imaging layer may be flood-applied over the ultra-thin sheet which is on the substrate (this stage is represented by FIG. 2*iv*) in the accompanying drawings). Suitably this imaging layer is more soluble—preferably much more soluble—in a given solvent (developer) than the substrate (and more soluble, preferably much more soluble—than the release layer on the substrate, when such a release layer, described above, is present). In one embodiment a suitable imaging layer comprises poly(methyl glutarimide) (PMGI), for example a PMGI/SI805 photoresist stack. The imaging layer is exposed and developed in the solvent such that a portion of the imaging layer remains in place, over the central region of the ultra-thin sheet, whilst the imaging layer no longer covers the lateral regions of the ultra-thin sheet (this stage is represented by FIG. 2*v*) in the accompanying drawings). The substrate is suitably unaffected by the solvent. It will be appreciated by the person skilled in the art that the lithographic technique could be the application of imaging energy to the central region of the imaging layer so as to render it less soluble than the unexposed lateral regions (negative working); or the delivery of energy to the lateral regions of the imaging layer, to render them preferentially more soluble, compared with the unexposed central region (positive working).

Other materials suitable for use in lithographic methods include phenolic resins, notably novolak resins, resole resins and novolak/resole resin mixtures; poly-3-hydroxystyrene; poly-4-hydroxystyrene; copolymers of 3-hydroxystyrene or 4-hydroxystyrene, for example with styrene substituted with one or more moieties selected from methyl, methoxy and hydroxy groups, for example with 3-methyl-4-hydroxystyrene or 3-methyl-3-hydroxystyrene or 4-methoxystyrene; copolymers of (meth)acrylic acid, for example with styrene; polymers and copolymers of 4-hydroxyphenylmethacrylamide; copolymers of maleiimide, for example with styrene; hydroxy or carboxy functionalised celluloses; dialkylmaleiimide esters; copolymers of maleic anhydride, for example with styrene; functionalised polymers of polyvinylalcohol, for example the acetals, for example salicaldehyde or 4-hydroxybenzaldehyde or 3-hydroxybenzaldehyde; polymers and copolymers of 3-vinylalkylsulphamates or 4-vinylalkylsulphamates; and partially hydrolysed polymers of maleic anhydride.

The nature of the lithographic or vaporisation technique employed is not material to the working of the invention. Lithographic techniques are preferred. Thus the skilled person can choose a positive working system or negative working lithographic system; and can choose from different modes for delivering energy, depending upon the system selected (for example electron-beam irradiation, ultra-violet irradiation, or alternative electromagnetic irradiation. There are many different polymer materials which could be selected for the imaging layer. In making the selection the most important points are that the imaging layer should be more soluble in the solvent than the substrate as a whole (and more soluble than the release layer, when provided); and that a portion of the imaging layer should remain in place over the central region of the ultra-thin layer, in order to mask or protect that central region in later stages of the process.

The support member can now be formed in situ. The remaining region of the imaging layer will prevent its application to the central region of the ultra-thin sheet. The fact that the lateral regions of the ultra-thin sheet are exposed beyond the remaining region of the imaging layer means that the material of the support can adhere to those lateral regions of the ultra-thin layer. In an alternative method, the support member may be formed directly on the substrate without lithographic processing if deposition of the support member material occurs through a suitable stencil or physical mask. Alternatively the support member may be formed directly on the substrate via evaporation (vapour deposition) if the masking material is sufficiently thick to permit lift-off processing (as indicated by FIGS. 2*v*) and 2*ix*), route B). Alternatively, for soluble conductive substrates the support member could be formed by electrodeposition or similar process directly without a strike/adhesion and release layer (indicated in FIG. 2*ix*), route C).

In an alternative, preferred, embodiment in which the support has an underlayer, the material of the underlayer could be flood-applied (that is to say, to cover the upper, exposed, lateral parts of the substrate, and the said remaining portion of the imaging layer). This stage is represented by FIG. 2*vi*) in the accompanying drawings.

Said remaining portion of the imaging layer can then be dissolved in a solvent or removed by vaporisation under the influence of heat and/or vacuum. This remaining portion of the imaging layer suitably creates a discontinuity in a sufficiently thin (in practice less than the thickness of the imaging layer) flood-coated underlayer. This discontinuity exposes the remaining portion of the imaging layer to the solvent. This stage is represented by FIG. 2*v*) in the accompanying drawings.

If wished steps 2*iv*) and 2*v*) could be repeated. However this may not be needed.

The material of the flood-coated underlayer which is deposited on the remaining portion of the imaging layer is thereby carried away into the solvent leaving the material of the flood-coated underlayer on the upper surface of the substrate and in contact with the lateral regions of the ultra-thin sheet, but not the central region, thereby defining the strike layer. However that central region may now be masked by a masking portion which is soluble in a solvent or developer, or which is vaporisable. This masking portion may be produced by flood-applying a layer of a material and subjecting it to a lithographic and/or vaporisation stage (see FIG. 2*viii*) in the accompanying drawings) as described above, the lateral regions being removed by the applicable solvent, leaving the masking portion. Once the masking portion is in place the support member can be formed (or the remainder of the support member, when an underlayer has already been applied). The masking portion prevents the material of the support from depositing on the ultra-thin sheet. This stage is represented by FIG. 2*ix*) in the accompanying drawings.

Thus the embodiments described form an intermediate article having an ultra-thin sheet sandwiched between the substrate on one side and the support member, surrounding a masking portion, on the other side. This intermediate article represents a second aspect of the present invention. This aspect may be further defined as: an article comprising an ultra-thin sheet having a substrate on one side and a support member, surrounding a masking region, on the other side, the central region of the ultra-thin sheet being overlaid by the masking region, and the lateral regions of the ultra-thin sheet and the lateral regions of the substrate being overlaid by the support member, wherein the support member and the masking region are removable (for example solvent-removable and/or removable by vaporisation).

A solvent (sometimes called a stripper) may then be used to remove both the masking portion and the substrate of the intermediate article. This may be achieved by use of a solvent to remove the masking portion and the entire substrate by dissolution. Preferably, however, a release layer is provided as part of the substrate and this is dissolved, but not the base layer. This stage is represented by FIG. 2x) in the accompanying drawings, and is representative of the first aspect of the present invention.

Alternatively or additionally the masking portion and/or the substrate or a release layer, may be removed by vaporisation, on application of heat and/or vacuum.

The ultra-thin sheet may be dried. Critical point drying may be employed but it is believed that it may not be needed, at least in some embodiments, because of the robustness of the arrangement, with the support member supporting the ultra-thin sheet around its lateral regions.

What is left, at the end of this process, is the support member, carrying the ultra-thin sheet; the separated article of FIG. 2x). The article may be of suitable dimensions and design to use in studying the ultra-thin sheet in transmission electron microscopy. It may also provide a means to transfer the ultra-thin sheet to another substrate less suitable for the production and identification of ultra-thin materials. It may also provide a means of using the ultra-thin sheets as support materials for transmission electron microscopy. It may also form part of a wider micro(electro)mechanical system. It may also form a transparency calibration standard. It may also form a filter for electromagnetic radiation based on the properties of the ultra-thin sheet. It may also form a semi-permeable membrane for the filtering or sorting of fluids or solutions, via a pressure gradient or concentration gradient (osmosis). It may also form a fluid pressure sensor based on the stress/strain-induced modification of the electronic properties of the ultra-thin sheet. It may also provide a means of detecting minute (preferably monomolecular) quantities of chemicals in fluid media based on the absorbance of said chemicals onto the surface of the ultra-thin sheet and the induced modification of the electronic or structural properties of the ultra-thin sheet.

Suitably an article in accordance with the second aspect of the present invention, for example for use as a support material for electron microscopy, is of overall area in the range 1 mm$^2$ to 50 mm$^2$, preferably 2 to 30 mm$^2$, most preferably 5 to 10 mm$^2$.

Suitably the size of the free area of the ultra-thin sheet is limited only by the properties and the initial size of the ultra-thin sheet; the methods described readily scale with the size of ultra-thin sheets which are available.

Preferably an article in accordance with the second aspect is disc-shaped overall. It may have radial ribs and, at the centre of the article, a hub-like region, the hub-like region circumscribing a central opening in which the ultra-thin sheet is present, without being overlaid by any other material.

One alternative to the sequences of steps described above is to use a stencil or template when applying a protective screen of material over the ultra-thin sheet, but leaving its lateral edges exposed; then forming the support member in situ, over the unscreened regions of the ultra-thin sheet and substrate, including an underlayer if required; removing the protective screen and the substrate using a solvent in the manner described above.

There are several other variations which can be employed to achieve the desired product.

In accordance with a third aspect of the present invention there is provided an article which comprises an ultra-thin sheet secured at its lateral regions to a support member, the ultra-thin sheet having at least one region inboard of said lateral regions, which inboard region is free from being overlaid with any other material.

In this third aspect the ultra-thin sheet material and the support are preferably as described and defined above with reference to the first aspect.

Further aspects are set forth in accompanying claims.

In further aspects the invention may be defined as any novel intermediate article described herein or as depicted herein in the FIG. 2 drawings; or any process described herein for making any novel article as described or depicted herein; or any product of any such process.

The invention will now be further described, by way of example, with reference to the accompanying drawings, in which:

FIG. 1 shows a support member which supports an ultra-thin sheet of material, for example a monoatomic graphene sheet. The graphene sheet may be detected under a suitable optical microscope and its thickness (in terms of mono-atomic, diatomic, triatomic etc. layers) may be assessed by an operator with a trained eye, using a good quality optical microscope.

Figures 1, 2:
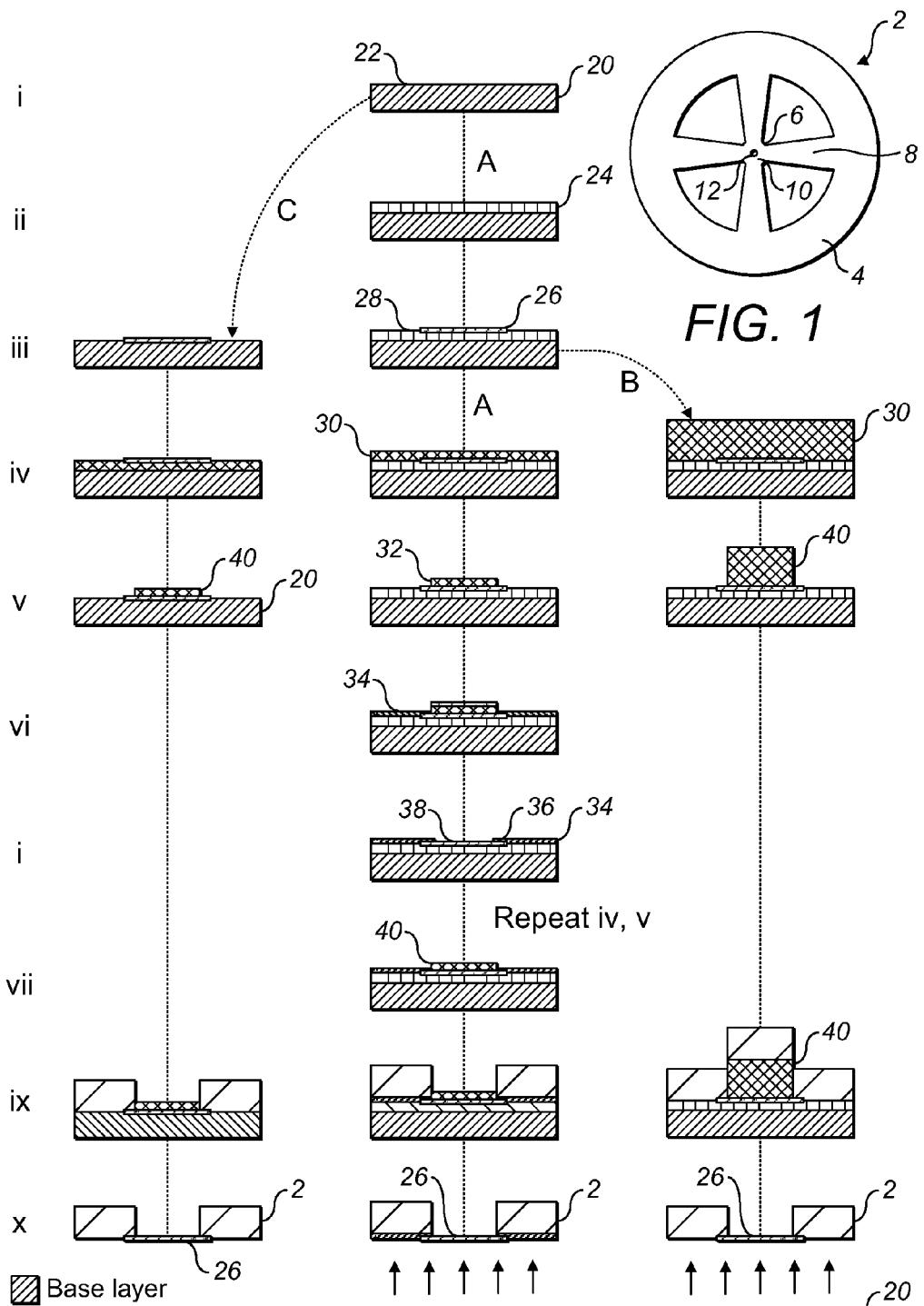
FIG. 1 is a plan view of a generally annular article in accordance with the second aspect.
FIG. 2, made up of FIGS. 2i) to FIG. 2x) are representational side views of the article of FIG. 1. showing the stages by which it is produced. The diagrams are not to scale, and are only illustrations of diametrical axial slices through the central region 10 shown in FIG. 1.

The support member comprises a disc 2 of copper, 3 mm in diameter. The support member has an outer ring 4, a hub-like region 6 at the centre and optionally a number of radial members or "spokes" 8 (four in this non-limiting embodiment) between the outer ring 4 and the hub-like region 6. The hub-like region 6 has an annular outer part 10 at which the radial members terminate, and inside the annular part 10, an unoccluded circular region 12. It is in this circular region 12 that a monoatomic flake of graphene is carried, mounted to the annular part 10.

The article shown in FIG. 1 is a support grid for a transmission electron microscope (TEM).

The formation of the article of FIG. 1 will now be described, by way of illustration of one embodiment only, with reference to FIG. 2. This shows a sequence of stages, from i) to x), along the sequence labelled A, which will be described in order, as follows. Two variant sequences, B and C, are shown for example purposes only, and will be described later.

FIG. 2i): a silicon wafer 20 was selected, having a very flat upper surface 22 formed by cleavage from a larger silicon piece. The thickness was 550 μm.

FIG. 2ii): a PMMA-based electron beam resist (sourced from MicroChem Corp.) was full-coated (that is, flood-coated or overall coated) by spinning onto the upper surface 22 of the silicon and allowed to dry, to form a layer 24, of thickness 90 nm. It is found that the contrast of the graphene flake under a suitable optical microscope is optimised when it is on a PMMA layer of thickness 80-100 nm or 250-310 nm, but preferably about 90 or about 280 nm, to enhance the optical contrast of graphene flake on the PMMA surface.

FIG. 2iii): a suitable graphene flake 26 was identified, and manipulated onto the upper surface 28 of the PMMA release layer, using adhesive tape.

In the terminology used in the definitional passages of this specification the silicon is the base layer, the PMMA layer is the release layer 24; and these two layers together constitute the substrate.

FIG. 2iv): a bilayer of the polymers PMGI and S1805 (sourced from MicroChem Corp.) was spin-coated as an imaging layer 30 over the graphene flake and the PMMA release layer, to a thickness of 200 nm each, and baked dry.

FIG. 2v): photolithography was undertaken using a Karl Suss MJB 3 Mask Aligner, exposed through a photomask containing a TEM grid design. Following exposure to UV radiation the imaged regions became preferably soluble in a developer (the system thus being a positive working system). Development removed the exposed lateral regions of the PMGI/S1805 imaging layer, leaving the central region 32 of the PMGI/S1805 imaging layer, which has not been subjected to exposure, in the shape of a disc, on the graphene flake, but leaving the lateral regions of the flake exposed.

FIG. 2vi): a metallic layer 34 was then applied to exposed upper regions of the intermediate article, shown in FIG. 2v), by thermal evaporation, so that it covers the exposed surface of the PMMA release layer, the upper surface of the remaining central region of the imaging layer 32, and the exposed lateral regions of the graphene flake. The metal layer comprises a 100 nm thickness gold "strike layer" to improve the qualities of the electrodeposited copper by providing a smooth, clean conductive layer for the copper to adhere to, and a 5 nm thickness chromium adhesion layer to improve the adhesion force between the graphene and the strike layer, and hence the support member. It will be seen that the PMGI/S1805 disc is not fully covered—its side wall is still exposed.

FIG. 2vii): the central region 32 of residual PMGI/S1805 was now removed by immersion in a 2.45 wt % TMAH solution (which may be purchased as MF-319 developer, MicroChem Corp.) at 70° C. This developer exhibits a very low dissolution rate for PMMA, but a faster dissolution rate for PMGI/S1805. It will be seen that at this stage in the preparation the metallic layer 34 covers the lateral regions of the PMMA release layer, and also the lateral regions 36 of the graphene sheet, but not its central region 38.

FIG. 2viii): after thorough washing the sample was remasked with imaging resist (PMGI/S1805, as described above) to prevent electrodeposition on the central region of the graphene sheet. This lithography step can be aligned to, and can use identical lithographic materials and techniques as, the lithography step used to define the strike layer (if one is present). This is indicated by the reference "repeat iv, v" in the drawings. As a result the graphene flake is protected or masked by a central zone 40 of resist.

FIG. 2ix): if the support member is to be formed by electrodeposition then electrical contact is made to the intermediate product using, for example, conductive epoxy, conductive paint, positionable microprobes or similar. Next, copper is electrochemically deposited on the strike layer 34, to complete the formation of the support member. A copper sulphate/sulphuric acid electrolyte was chosen, and electrochemical deposition took place in a custom-built cell using a constant current, to deposit a thickness of 10-15 µm of copper. If necessary the potential could be controlled using a reference electrode and potentiostat. Additives such as levellers and carriers suitable for the electro- or electro-less deposition process in question could be added to the cell to enhance the characteristics of the deposited copper but are preferably not used, since properties are adequate without such compounds, and since they being about the possibility of increased contamination.

FIG. 2x): after electrodeposition the intermediate article shown in FIG. 2ix) is washed in deionised water. It is then immersed in acetone, or another suitable solvent, to remove by dissolution the PMMA release layer 24 and the PMGI/S1805 central region 40. In this way the copper support member 2, with the graphene sheet attached, is released, without being subject to mechanical stress. The silicon layer 20 does not dissolve and could be re-used.

The hub region of the support member 2 can be seen, separated from the silicon layer 20, in FIG. 2x); and the whole of the support member 2 in FIG. 1. The graphene sheet is held around its lateral regions by the support member. More specifically, the graphene flake is adhered to and/or embedded around the whole of its periphery in the strike/adhesion layer 34. The strike layer thus performs two important functions in the process. Firstly it facilitates the electrodeposition of the copper. Secondly it forms a strong bond to the adhesion layer, which serves as a material to which the graphene sheet reliably and securely adheres.

Optionally the support member 2 could be subjected to critical point drying as carried out in the prior art mentioned above. However this is not an essential feature of the invention.

FIG. 2 sequence B illustrates the direct formation of the support member using a thick layer of lithographic resist. The steps followed are the same as already described in FIG. 2B sequence A up to step 21v), except that the imaging layer 30 is much thicker; thicker in fact than the intended thickness of the support member, yet to be formed; and the support member is formed by direct evaporation. The masking region 40 is exposed to solvent in step 21v) of sequence B, and dissolves. So does the release layer, but the support member does not. However the cap of support member material on the masking portion 40 is thereby detached from the support member 2, as is the base layer 20.

FIG. 2 sequence C illustrates the production of an ultra-thin sheet on a conductive soluble substrate, requiring no strike/adhesion layer. In this variant there is no release layer. Further there is no strike layer/adhesion layer. The substrate consists of a conductive material, for example silicon carbide, doped as necessary, or a conductive polymer. Thus the ultra-thin sheet is provided on the monolithic substrate; a central masking region 40 is provided in the manner described above; the support member, a conductive part, is formed directly on the conductive substrate; and a solvent, or two solvents applied in sequence, is/are used to dissolve the masking region 40 and the substrate.

The invention claimed is:

1. A method of making an article which comprises a support member having a central region surrounded by a peripheral region, and an ultra-thin sheet of material secured at its lateral regions to the peripheral region of the support member, the method comprising the steps of:
providing an ultra-thin sheet on a substrate,
forming the support member in situ on the lateral regions of the ultra-thin sheet such that the lateral regions of the ultra-thin sheet are sandwiched between the support member and the substrate and adhered to the support member, wherein the forming step comprises depositing a material from a liquid or vapour, and,
removing the substrate to leave the article, wherein the ultra-thin sheet has at least one free area inboard of said lateral region where the ultra-thin sheet is not overlaid by any other material.

2. A method according to claim 1 in which the ultra-thin sheet has at least one free area inboard of said lateral region, and where the ultra-thin sheet is supported only by the support member at the lateral regions of the ultra-thin sheet.

3. A method according to claim 1 in which the free area of the region, is at least 500 µm$^2$.

4. A method according to claim 1, wherein the substrate is removed by vaporisation.

5. A method according to claim 1, wherein the substrate is removed by a dissolution step, using a solvent.

6. A method according to claim 5 in which the substrate has a release layer and a base layer, which are respectively soluble and insoluble in a selected solvent, the release layer being in contact with the ultra-thin sheet.

7. A method according to claim 1, wherein the free area is masked by a portion of a material which is soluble in said selected solvent; said portion and said release layer being dissolved in the solvent in the same operation or being dissolved in different solvents in respective operations.

8. A method according to claim 1, wherein the support member is formed on the regions of the substrate around the ultra-thin sheet and on the lateral regions of the ultra-thin sheet, but not on the central region of the ultra-thin sheet.

9. A method according to claim 1, wherein the support member comprises an underlayer which is in contact with the lateral regions of the ultra-thin sheet but not the central region, and an upper layer which is formed on the underlayer.

10. A method of making an article comprising an ultra-thin sheet having a substrate on one side, and a support member having a central region surrounded by a peripheral region surrounding a masking region, on the other side, a central region of the ultra-thin sheet being overlaid by the masking region, and lateral regions of the ultra-thin sheet and the lateral regions of the substrate being overlaid by the peripheral region of the support member, wherein the support member and the masking region are removable, wherein the method includes the steps of:
  forming the support member in situ, wherein the forming step comprises depositing a material from a liquid or vapor,
  forming the masking region on the ultra-thin sheet, leaving the lateral region of the ultra-thin sheet exposed, and
  subsequently using the masking region in subsequently forming the carrier member.

11. A method of making an article comprising the steps of:
a) providing a substrate having a release layer which is soluble in a first solvent, on a base layer which is less soluble, or insoluble, in the first solvent;
b) laying an ultra-thin sheet onto the release layer of the substrate;
c) overall-coating the intermediate article, to cover the ultra-thin sheet and the exposed regions of the release layer, with an imaging layer of a second material which is soluble in a second solvent, in which solvent the release layer is less soluble, or insoluble;
d) removing lateral regions of the imaging layer by lithographic imaging and development in the second solvent, leaving a central region of the second material on the ultra-thin sheet, but so as to leave its margins exposed;
e) overall-applying a support material underlayer to the upper regions of the intermediate article, of step d);
f) removing the central region of the second material using a solvent, to expose the ultra-thin sheet, but with its margins in contact with the underlayer;
g) forming a masking region over the previously exposed central region of the ultra-thin sheet, the masking region being of the first material or of a material which is also soluble in the first solvent;
h) forming the rest of the support material on the underlayer; and
i) using the first solvent to remove the masking region and the release layer of the substrate, to leave an article comprising a free area of the ultra-thin sheet, corresponding to the location of the removed masked region, supported around its periphery by the support member.

12. A method of making an article comprising the steps of:
a) providing a substrate having a vaporisable release layer, on a base layer;
b) laying an ultra-thin sheet onto the release layer of the substrate;
c) overall-coating the intermediate article, to cover the ultra-thin sheet and the exposed regions of the release layer, with an imaging layer of a material which is soluble in a solvent, in which solvent the release layer is less soluble, or insoluble;
d) removing lateral regions of the imaging layer by lithographic imaging and development in the solvent, leaving a central region of the second material on the ultra-thin sheet, but so as to leave its margins exposed;
e) overall-applying a support material underlayer to the upper regions of the intermediate article, of step d);
f) removing the central region of the second material using said solvent, to expose the ultra-thin sheet, but with its margins in contact with the underlayer;
g) forming a masking region over the previously exposed central region of the ultra-thin sheet, the masking region being of the material which is soluble in a solvent, or vaporisable;
h) forming the rest of the support material on the underlayer; and
i) dissolving in a solvent, or vaporising away, the masking region and vaporising away the release layer of the substrate, to leave an article comprising a free area of the ultra-thin sheet, corresponding to the location of the removed masked region, supported around its periphery by the support member.

13. A method according to claim 1, wherein the ultra-thin sheet of material secured only at its lateral regions to the peripheral region of the support member.

* * * * *